(12) United States Patent
Anzai et al.

(10) Patent No.: US 6,947,322 B2
(45) Date of Patent: Sep. 20, 2005

(54) SEMICONDUCTOR MEMORY DEVICE

(75) Inventors: Shinsuke Anzai, Tenri (JP); Yasumichi Mori, Nara (JP); Hidehiko Tanaka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/630,641

(22) Filed: Jul. 29, 2003

(65) Prior Publication Data

US 2004/0114430 A1 Jun. 17, 2004

(30) Foreign Application Priority Data

Jul. 30, 2002 (JP) ........................................ 2002-221145
May 26, 2003 (JP) ........................................ 2003-148335

(51) Int. Cl.$^7$ .............................................. G11C 16/04
(52) U.S. Cl. ............................. 365/185.03; 365/185.21
(58) Field of Search ....................... 365/185.03, 189.09, 365/189.02, 218, 185.29, 185.21

(56) References Cited

U.S. PATENT DOCUMENTS 5,831,900 A * 11/1998 Miyamoto ............. 365/185.03
6,473,321 B2 * 10/2002 Kishimoto et al. ........... 363/59
6,771,537 B2 * 8/2004 Jyouno et al. ......... 365/185.03

FOREIGN PATENT DOCUMENTS

JP 2001-202788 7/2001

* cited by examiner

*Primary Examiner*—Thong Q. Le
(74) *Attorney, Agent, or Firm*—Morrison & Foerster LLP

(57) ABSTRACT

A semiconductor memory device is provided, which comprising a memory cell array comprising a two-value memory region and a multi-value memory region, in which the two-value memory region comprises a plurality of memory cells each storing 1-bit data and the multi-value memory region comprises a plurality of memory cells each storing 2 or more-bit data, and a sense amplifier section common to data read of the two-value memory region and data read of the multi-value memory region, for reading data stored in a selected memory cell by comparing a potential of the selected memory cell with a reference potential.

7 Claims, 9 Drawing Sheets

SEMICONDUCTOR MEMORY DEVICE

BACKGROUND OF THE INVENTION

1. Field of the Invention

The present invention relates to a semiconductor memory device (e.g., flash memory) having a multi-value memory region and a two-value memory region on the same chip.

2. Description of the Related Art

Conventionally, electronic apparatuses are generally provided with a semiconductor memory device for storing a control program, which controls the operation of an electronic apparatus, or various data (e.g., audio data or image data).

Recently, a mobile telephone service in which image data can be transmitted and received in addition to character data has been opened. Such a service is partly achieved by the increasing capacity of a flash memory mounted on a mobile telephone apparatus. Set top boxes (STBs), such as BS digital tuners and the like, also have a large-capacity flash memory. The proportion of the price of a memory relative to the price of a whole system is increasing. Therefore, there is a demand for less expensive memories.

In these circumstances, multi-value main memory technology is advancing to provide low-cost large capacity memories. The multi-value main memory technology permits each memory cell to store 2 bits or more of data (multi-value data) instead of one bit of data (two-value data). For example, when 2 bits of data (four-value data) are stored in a single memory cell, a memory cell array occupying the same area may have a two-fold larger capacity of data than a conventional two-value array. Therefore, the cost per unit memory capacity can be reduced.

For example, Japanese Laid-Open Publication No. 2001-202788 discloses a semiconductor memory device having a multi-value memory region and a two-value memory region on the same chip in order to achieve high reliability in high-speed access applications.

In the semiconductor memory device disclosed in Japanese Laid-Open Publication No. 2001-202788, a memory cell array on a chip is divided into a plurality of regions. Each segmental region may be arbitrarily set to be a four-value memory region or a two-value memory region. The two-value memory region has a small capacity, but data may be read from the two-value memory region at high speed. In the two-value memory region, a control program or the like is stored. The four-value memory region has a large capacity and is used to store various data.

The potential of a selected memory cell is generated by current-voltage conversion of a current flowing through the cell. In the four-value memory region, a four-value sense amplifier is used to compare the potential of a selected memory cell with reference potentials in order to read data from the cell. In the two-value memory region, a two-value sense amplifier is used to compare the potential of a selected memory cell with a reference potential in order to read data from the cell.

The four-value sense amplifier for reading data from a memory cell in the four-value memory region is separately provided from the two-value sense amplifier for reading data from a memory cell in the two-value memory region.

Japanese Laid-Open Publication No. 7-281952 discloses a semiconductor memory device having a plurality of memory regions (blocks). This semiconductor memory device comprises a delete/write/read control section which allows separate memory blocks to simultaneously perform two or more different memory operations selected from a plurality of predetermined memory operations (e.g., data delete, data write, and data read).

The delete/write/read control section determines whether or not data is being deleted from a predetermined memory block and whether or not data is being written into the predetermined memory block. When data is not being deleted from the predetermined memory block and data is not written into the predetermined memory block, the delete/write/read control section permits the reading of data from the predetermined memory block.

The delete/write/read control section also determines whether or not data is being deleted from a predetermined memory block. When data is not being deleted from the predetermined memory block, the delete/write/read control section permits the writing of data into the predetermined memory block.

The delete/write/read control section determines whether or not data is being written into a predetermined memory block. When data is not being written into the predetermined memory block, the delete/write/read control section permits the deletion of data stored in the predetermined memory block.

In the semiconductor memory device of Japanese Laid-Open Publication No. 2001-202788, the sense amplifiers (i.e., the four-value sense amplifier and the two-value sense amplifier) cannot simultaneously read data stored in a memory cell of the four-value memory region and data stored in a memory cell of the two-value memory region. Therefore, when one of the sense amplifiers is being used to read data, the other sense amplifier is not used and is wasted.

In the semiconductor memory device (e.g., flash memory) of Japanese Laid-Open Publication No. 2001-202788, particularly when a user sets a portion of a memory cell array to be a four-value memory region and the remaining portion of the memory cell array to be a two-value memory region, there is consistently an unused portion in the memory device (i.e., a two-value sense amplifier or a four-value sense amplifier). Therefore, there is a large waste of chip size and power consumption.

In the semiconductor memory device of Japanese Laid-Open Publication No. 7-281952, the reading of data from a plurality of memory regions (memory blocks) and the writing of data into a plurality of memory regions can be simultaneously performed. However, Japanese Laid-Open Publication No. 7-281952 does not describe a multi-value memory region and a two-value memory region. Japanese Laid-Open Publication No. 7-281952 does not relate to a semiconductor memory device having a multi-value memory region and a two-value memory region on the same chip.

SUMMARY OF THE INVENTION

According to an aspect of the present invention, a semiconductor memory device comprises: a memory cell array comprising a two-value memory region and a multi-value memory region, in which the two-value memory region comprises a plurality of memory cells each storing 1-bit data and the multi-value memory region comprises a plurality of memory cells each storing 2 or more-bit data: and a sense amplifier section common to data read of the two-value memory region and data read of the multi-value memory region, for reading data stored in a selected memory cell by comparing a potential of the selected memory cell with a reference potential.

In one embodiment of this invention, the semiconductor memory device further comprises a first switch section for switching the reference potential, depending on whether data is read from the two-value memory region or the multi-value memory region.

In one embodiment of this invention, the semiconductor memory device further comprising a conversion section for changing the number of bits in accordance with a result of a comparison performed by the sense amplifier section, and switching output data, depending on whether or not the data is read from the multi-value memory region or the two-value memory region.

In one embodiment of this invention, the conversion section has two or more output terminals. When data is read from the two-value memory region, the conversion section outputs the data through the output terminals, all bits of the data having the same value.

In one embodiment of this invention, the semiconductor memory device further comprises: a redundant cell for replacing a defective memory cell in the memory cell array, if any; and a switch section for receiving data read from the selected memory cell and data read from the redundant cell, and switching from the data read from the selected memory cell to the data read from the redundant cell when the selected memory cell is the defective memory cell.

In one embodiment of this invention, the semiconductor memory device further comprises a write/delete control section for controlling data write or data delete for the two-value memory region and the multi-value memory region separately. The sense amplifier section can perform data read for one of the two-value memory region and the multi-value memory region while the write/delete control section is performing data write or data delete for the other of the two-value memory region and the multi-value memory region.

In one embodiment of this invention, the semiconductor memory device further comprises a write/delete control section for controlling data write or data delete for the two-value memory region and the multi-value memory region separately. The write/delete control section can perform data write or data delete for one of the two-value memory region and the multi-value memory region while the sense amplifier section is performing data read for the other of the two-value memory region and the multi-value memory region.

Hereinafter, functions of the present invention will be described.

The semiconductor memory device of the present invention comprises a memory cell array including a multi-value memory region and a two-value memory region on the same chip. The semiconductor memory device of the present invention switches reference voltages which are used in a sense amplifier section common to the data read of the two-value memory region and the data read of the multi-value memory region, by using a first switch section.

Therefore, the semiconductor memory device of the present invention can use a read path common to the data read of the two-value memory region and the data read of the multi-value memory region. Therefore, the present invention can avoid the conventional necessity that a sense amplifier for the data read of the two-value memory region and a sense amplifier for the data read of the multi-value memory region are separately required. Thus, the present invention can remove a wasted region, thereby making it possible to reduce manufacturing cost. The present invention can provide a semiconductor memory device having a small size and low power consumption, compared to conventional semiconductor memory devices.

The result of comparison by the sense amplifier section is switched by the conversion section depending on whether data is read from the multi-value memory region or the two-value memory region. Thus, read data is switched between multi-value data and two-value data.

The conversion section comprises 2 or more output terminals. When data is read from the two-value memory region, a bit output through each terminal may have the same value.

For example, in a semiconductor memory device having a four-value memory region and a two-value memory region, when data is read from the two-value memory region, the conversion circuit converts a 3-bit signal output by the sense amplifier to a 2-bit signal in which the two bits have the same value. Therefore, two-value data can be obtained by a simple circuit configuration. Time required for circuit verification can be reduced.

The semiconductor memory device of the present invention may be provided with a redundant cell. When a defective memory cell is present in the four-value memory region or the two-value memory region, a third switch section can be provided to switch data read from the defective memory cell to data read from the redundant cell.

Further, the semiconductor memory device of the present invention has a write/delete control section for separately controlling data write/delete for the two-value memory region and data write/delete for the multi-value memory region. With the write/delete control section, while data write/delete is being performed for one of the two-value memory region and the multi-value memory region, data read can be performed by the sense amplifier section for the other memory region. Therefore, the operation speed is high and time required for circuit verification can be reduced.

Thus, the invention described herein makes possible the advantages of providing (1) a semiconductor memory device comprising a multi-value memory region and a two-value memory region on the same chip, in which a sense amplifier can be used to perform data read both for the multi-value memory region and the two-value memory region, thereby reducing the chip size and power consumption as compared to conventional semiconductor memory devices and (2) a semiconductor memory device having a multi-value memory region and a two-value memory region on the same chip, in which while data write/delete is being performed for one of the two-value memory region and the multi-value memory region, data read can be performed for the other memory region, whereby an operation speed can be increased.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

(Embodiment 1)

Figure 1:
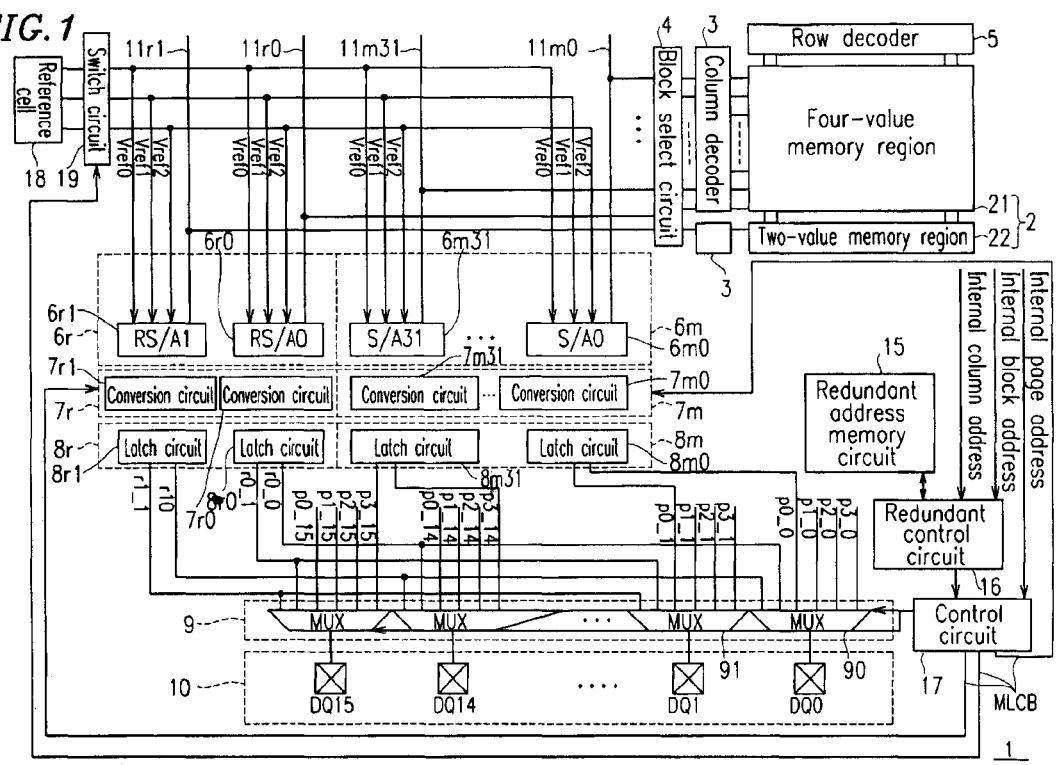
FIG. 1 is a diagram showing a configuration of a flash memory according to Embodiment 1 of the present invention.
Figure 2:
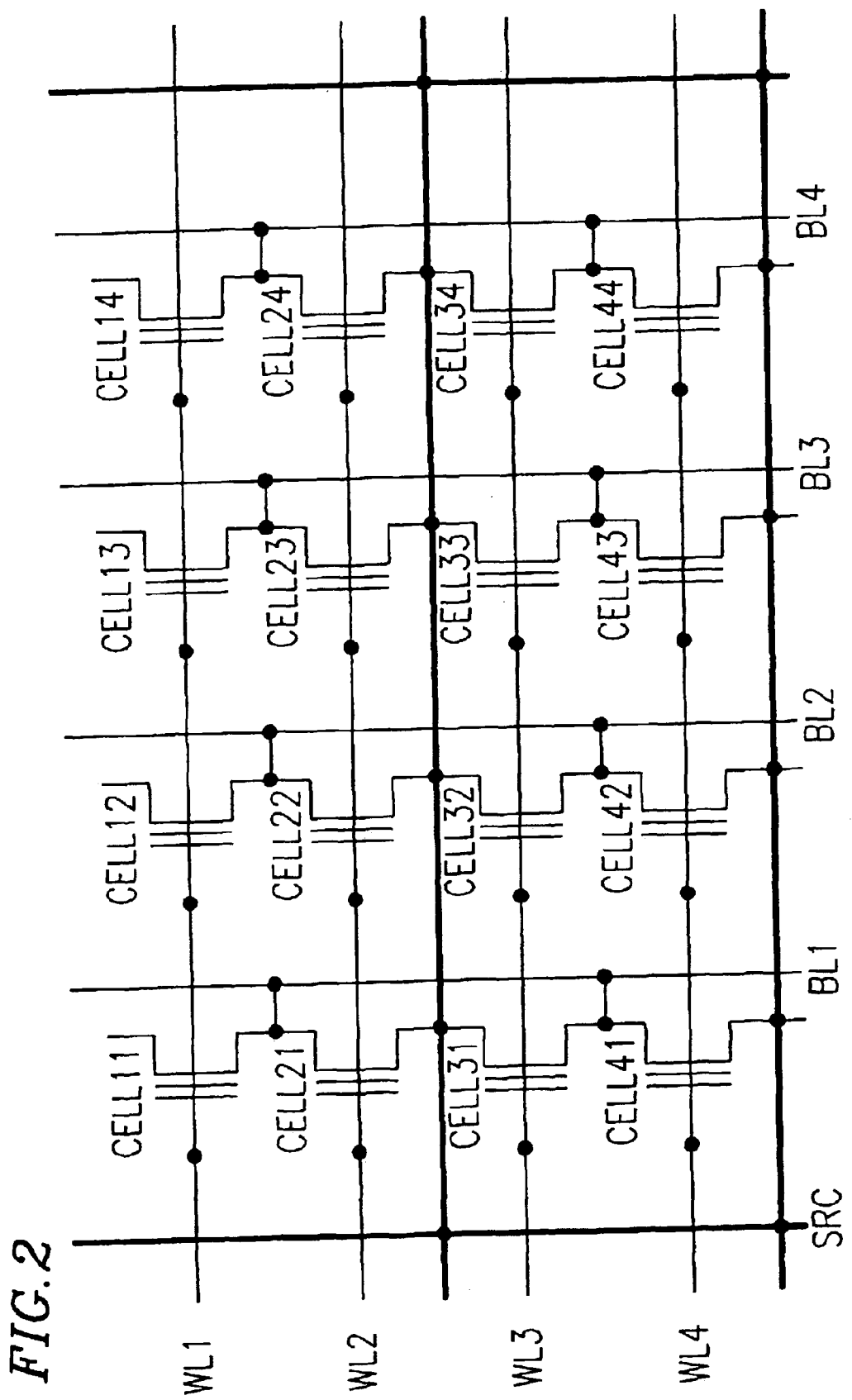
FIG. 2 is a diagram showing a major portion of a memory cell array in which a plurality of memory cells are arranged in a matrix comprising columns and rows.

FIG. 1 shows a configuration of a flash memory 1 according to Embodiment 1 of the present invention. FIG. 2 shows a major portion of a memory cell array 2 contained in the flash memory 1. Note that in Embodiment 1 of the present invention, only components involved in data read will be described. Explanation is omitted for other components (e.g., a write circuit, a delete circuit, a control circuit for controlling the write circuit, and a control circuit for controlling the delete circuit).

The flash memory 1 comprises a memory cell array 2 in which a plurality of memory cells capable of storing data are arranged in a matrix. The memory cell array 2 comprises a four-value memory region 21 and a two-value memory region 22. The flash memory 1 further comprises: a column decoder 3 for selecting at least one bit line from a plurality of bit lines connected to the four-value memory region 21 and a plurality of bit lines connected to the two-value memory region 22; a block select circuit 4 for selecting at least one memory block from a plurality of memory blocks: and a row decoder 5 for selecting at least one word line from a plurality of word lines connected to the four-value memory region 21 and a plurality of word lines connected to the two-value memory region 22.

The flash memory 1 further comprises: a normal cell sense amplifier 6m functioning as a sense amplifier section; a conversion circuit 7m connected to the normal cell sense amplifier 6m; and a latch circuit 8m connected to the conversion circuit 7m. A signal indicating a selected cell voltage is input via signal lines 11m0 to 11m31 to the normal cell sense amplifier 6m.

The flash memory 1 further comprises: a redundant cell sense amplifier 6r functioning as sense amplifier section; a conversion circuit 7r connected to the redundant cell sense amplifier 6r; and a latch circuit 8r connected to the conversion circuit 7r. A signal indicating a redundant cell voltage is input via signal lines 11r0 and 11r1 to the redundant cell sense amplifier 6r.

The flash memory 1 further comprises: a multiplexer (MUX) 9 for selecting at least one output from outputs of the latch circuit 8m and the latch circuit 8r; an output pad 10 connected to the multiplexer (MUX) 9; a redundant address memory circuit 15; a redundant determination circuit 16; a control circuit 17; a reference cell 18; and a switch circuit 19.

FIG. 2 shows an example of the memory cell array 2 in which a plurality of memory cells are arranged in a matrix having columns and rows, where each memory cell is represented by CELLxy (x=1 to 4, y=1 to 4).

The gate of a memory cell CELL1y (y=1 to 4) is connected to a word line WL1. The gate of a memory cell CELL2y (y=1 to 4) is connected to a word line WL2. The gate of a memory cell CELL3y (y=1 to 4) is connected to a word line WL3. The gate of a memory cell CELL4y (y=1 to 4) is connected to a word line WL4.

The drain of a memory cell CELLx1 (x=1 to 4) is connected to a bit line BL1. The drain of a memory cell CELLx2 (x=1 to 4) is connected to a bit line BL2. The drain of a memory cell CELLx3 (x=1 to 4) is connected to a bit line BL3. The drain of a memory cell CELLx4 (x=1 to 4) is connected to a bit line BL4.

The source of a memory cell CELLxy (x=1 to 4, y=1 to 4) is connected to a common source line SRC in each block.

The drains of adjacent memory cells CELL are connected to each other and further to the bit line BL. The sources of adjacent memory cells CELL are connected to each other and further to the common source line SRC.

For example, the drains of adjacent memory cells CELL11 and CELL21 are connected to each other and further to the bit line BL1. The sources of adjacent memory cells CELL21 and CELL31 are connected to each other and further to the common source line SRC. The drains of adjacent memory cells CELL31 and CELL41 are connected to each other and further to the bit line BL1. The plurality of bit lines BL are each connected to the column decoder 3 and the like.

The memory cell array 2 comprises the four-value memory region 21 and the two-value memory region 22. The four-value memory region 21 stores four-value (2-bit) data. By providing the four-value memory region 21 in the main memory region of the flash memory 1, the capacity of the flash memory 1 can be increased and the cost of the flash memory 1 can be reduced. The two-value memory region 22 stores two-value (1-bit) data. For example, if the two-value memory region 22 is provided in a OneTime Programmable (OTP) region in the flash memory 1, the flash memory 1 can be made highly reliable.

The memory cell array 2 comprises auxiliary memory cells (hereinafter referred to as redundant cells). If any memory cell CELLxy is impaired by, for example, a short circuit in a word line, the impaired memory cell CELL is replaced with a redundant cell. A redundant cell has the same function as that of memory cell CELLxy. Note that memory cell CELLxy having no defect is referred to as a normal cell.

Figure 3:
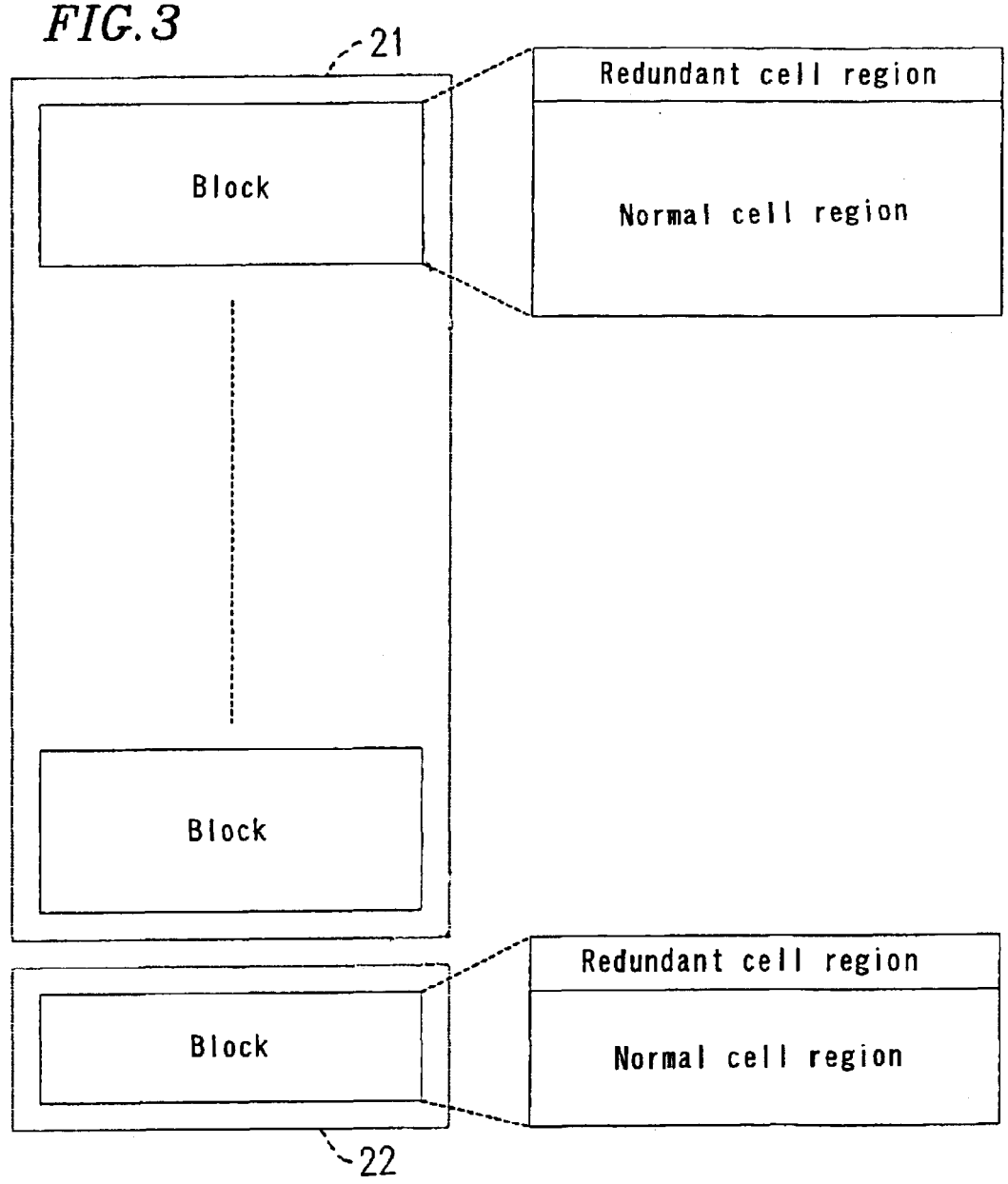
FIG. 3 is a diagram showing a schematic configuration of the memory cell array of FIG. 2 comprising a four-value memory region and a two-value memory region.

FIG. 3 shows a schematic configuration of the memory cell array 2 comprising the four-value memory region 21 and the two-value memory region 22.

The four-value memory region 21 comprises at least one memory cell block. The two-value memory region 22 comprises at least one memory cell block. A memory cell block comprises a normal cell region and a redundant cell region.

The flash memory 1 comprises the sense amplifier 6 (the normal cell sense amplifier 6m and the redundant cell sense amplifier 6r) used for the reading data from the two-value memory region 22 as well as the reading of data from the four-value memory region 21.

The normal cell sense amplifier 6m is used for the memory operation of the four-value memory region 21 as well as the memory operation of the two-value memory region 22. The normal cell sense amplifier 6m comprises a sense amplifier S/A0 to a sense amplifier S/A31. The redundant cell sense amplifier 6r is used for the memory operation of the four-value memory region 21 as well as the memory operation of the two-value memory region 22. The redundant cell sense amplifier 6r comprises a sense amplifier RS/A0 and a sense amplifier RS/A1.

For example, the normal cell sense amplifier 6m functions as a sense amplifier for reading data from a memory cell (normal cell) in the four-value memory region 21 (main memory region) as well as a sense amplifier for reading data from a memory cell (normal cell) in the two-value memory region 22 (OTP region). The normal cell sense amplifier 6m compares the voltage of a selected memory cell (normal cell) (the potential of a selected bit line) generated by current-voltage conversion of a cell current flowing through the cell, with reference potentials (reference voltages) Vref0 to Vref2 generated by current-voltage conversion of a cell current flowing through the reference cell 18, and amplifies the potential difference (the result of the comparison).

The redundant cell sense amplifier 6r functions as a sense amplifier for reading data from a redundant cell contained in the four-value memory region 21 as well as a sense amplifier for reading data from a redundant cell contained in the two-value memory region 22. The redundant cell sense amplifier 6r compares the voltage of a selected memory cell (redundant cell) generated by current-voltage conversion of a cell current flowing through the cell, with each of reference potentials Vref0 to Vref2 generated by current-voltage conversion of a cell current flowing through the reference cell 18, and amplifies the potential difference (the result of the comparison).

The sense amplifiers S/A0 to S/A31 and the sense amplifiers RS/A0 and RS/A1 all have the same configuration and layout.

The reference cell 18 comprises a plurality of memory cells having the same configuration as that of the normal cell. For example, the reference cell 18 comprises a plurality of reference cells. The reference cells are used to predetermine a threshold voltage value of each memory cell. The reference cell 18 outputs a reference potential, which is a voltage generated by current-voltage conversion of a cell current flowing through each reference cell. The reference potential output by the reference cell 18 is input via a switch circuit 19 (first switch section) to the normal cell sense amplifier 6m and the redundant cell sense amplifier 6r.

The switch circuit 19 comprises a multiplexer and the like. An identification signal MLCB is input from the control circuit 17 to the switch circuit 19. The identification signal MLCB is used to determine whether data read from the memory cell array 2 is two-value data (data stored in the two-value memory region 22) or four-value data (data stored in the four-value memory region 21). The switch circuit 19 switches the identification signal MLCB, depending on whether data is read from the two-value memory region 22 or the four-value memory region 21. The switch circuit 19 switches the reference potential for the normal cell sense amplifier 6m and the reference potential for the redundant cell sense amplifier 6r to respective optimal reference potentials in accordance with the identification signal MLCB. By using the normal cell sense amplifier 6m and the redundant cell sense amplifier 6r having the respective optimal reference potentials, both two-value data and four-value data can be read.

The normal cell sense amplifier 6m outputs a 3-bit signal to the conversion circuit 7m (conversion circuits 7m0 to 7m31) which in turn converts the signal to a 2-bit signal. The 2-bit signal is latched by the latch circuit 8m (latch circuits 8m0 to 8m31). The redundant cell sense amplifier 6r outputs a 3-bit signal to the conversion circuit 7r (conversion circuits 7r0 and 7r1) which in turn converts the signal to a 2-bit signal. The 2-bit signal is latched by the latch circuit 8r (latch circuits 8r0 and 8r1). The conversion circuit 7m and the conversion circuit 7r have the same configuration. The latch circuit 8m and the latch circuit 8r have the same configuration.

Figure 4:
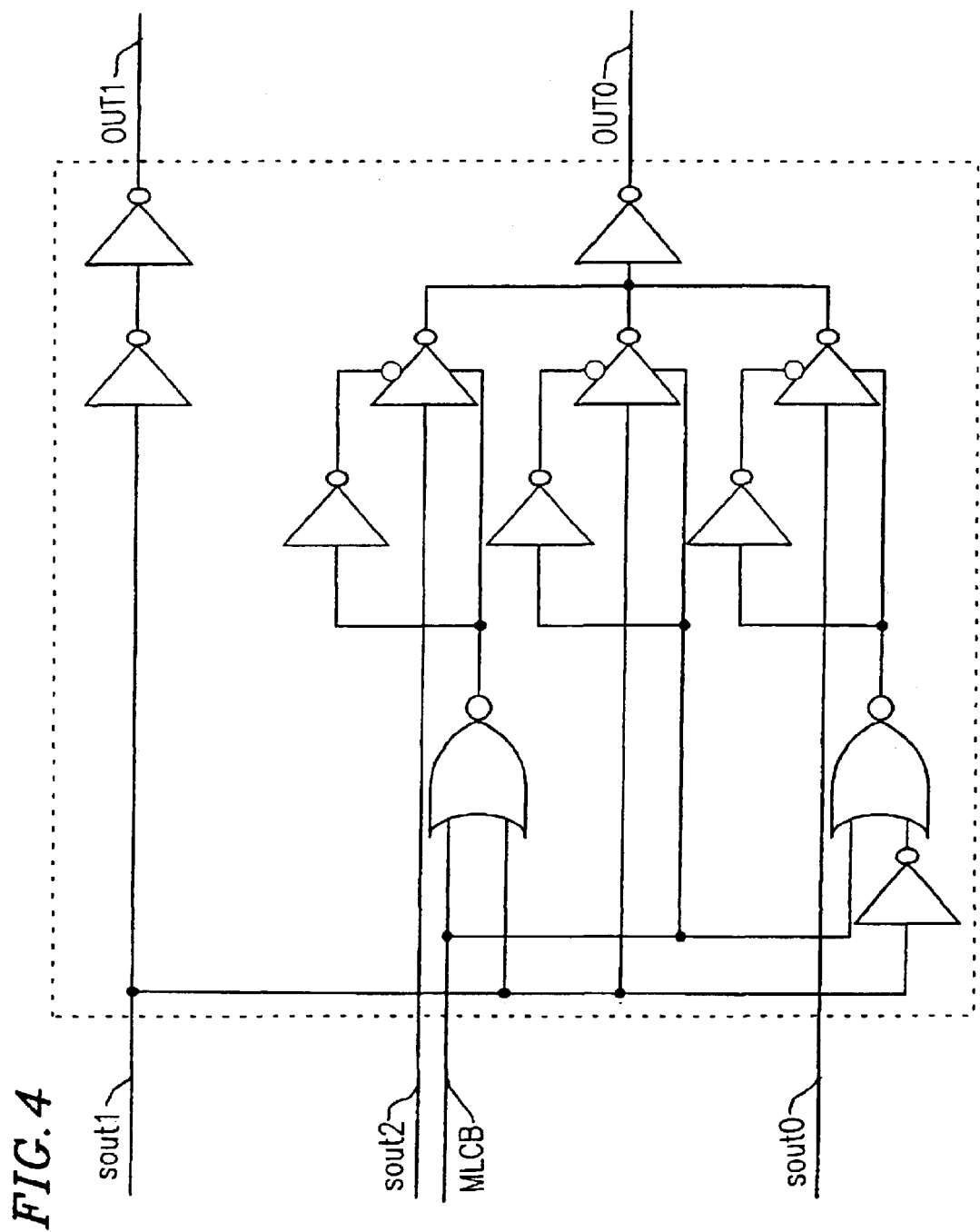
FIG. 4 is a diagram showing an exemplary configuration of a conversion circuit of FIG. 1.

FIG. 4 shows an exemplary configuration of the conversion circuit 7m or 7r of FIG. 1.

The conversion circuit 7m (or the conversion circuit 7r) comprises a combination of an inverter and a NOR circuit. The conversion circuit 7m (or the conversion circuit 7r) receives the 3-bit signal (results of comparison sout0 to sout2) output from the normal cell sense amplifier 6m (or the redundant cell sense amplifier 6r) and identification signal MLCB output by the control circuit 17. The identification signal MLCB is switched, for example, between "0" and "1" depending on whether data is read from the four-value memory region or the two-value memory region, and is input to the conversion circuit 7m (or the conversion circuit 7r).

For example, when data is read from the four-value memory region 21, the identification signal MLCB (="0") is input from the control circuit 17 to the conversion circuit 7m (or the conversion circuit 7r). In this case, out1=sout1. When sout1="1", out0=sout0. When sout1="0", out0=sout2. out0 and out1 represent signals output from the conversion circuit 7m (or the conversion circuit 7r).

For example, when data is read from the two-value memory region 22, the identification signal MLCB (="1") is input from the control circuit 17 to the conversion circuit 7m (or the conversion circuit 7r). out1 (=sout1) and out0 (=sout1) are output from the conversion circuit 7m (or the conversion circuit 7r).

The redundant address memory circuit 15 stores information representing the address of a defective memory cell. The redundant determination circuit 16 compares the address of a defective memory cell stored in the redundant address memory circuit 15 with a currently selected internal address (an internal column address and an internal block address) to determine whether or not the redundant cell is used. The result of determination by the redundant determination circuit 16 is supplied to the control circuit 17.

When the outputs of the latch circuit 8m and the latch circuit 8r are input to the multiplexer (MUX) 9 which functions as third switch section, the multiplexer (MUX) 9 selects one of the inputs in accordance with a control signal output by the control circuit 17. The multiplexer (MUX) 9 outputs the only selected output to the output pad 10.

Hereinafter, a read operation of the flash memory 1 will be described.

By using the row decoder 5 for decoding an address to drive a word line of a memory cell, the column decoder 3 for decoding an address to drive a bit line of a memory cell, and a block select circuit 4 for selecting a block, a total of 34 memory cells in a block (32 normal cells+2 redundant cells) are simultaneously selected and activated.

The signal line 11r0 and the signal line 11r1 connected to the respective bit lines of the two redundant cells are connected to the redundant cell sense amplifier 6r (the sense amplifier RS/A0 and the sense amplifier RS/A1). The signal lines 11m0 to 11m31 connected to the respective bit lines of the 32 normal cells are connected to the normal cell sense amplifier 6m (the sense amplifiers S/A0 to S/A31). The two redundant cells are prepared in order to replace any defective cell among the 32 normal cells. Note that three or more redundant cells may be provided.

In this case, cell currents flowing through selected memory cells (the normal cells and the redundant cells) are subjected to current-voltage conversion into signals indicating cell voltages. The signals are input via the signal lines 11m0 to 11m31 and the signal lines 11r0 and 11r1 to the normal cell sense amplifier 6m and the redundant cell sense amplifier 6r. The signals input via the signal lines 11m0 to 11m31 and the signal lines 11r0 and 11r1 are compared with the reference potentials Vref0 to Vref2.

The above-described operations are the same both when data is read from the four-value memory region 21 and when data is read from the two-value memory region 22.

Hereinafter, the flow of signals in the normal cell sense amplifier 6m and the redundant cell sense amplifier 6r and thereafter will be described with reference to FIGS. 1 and 5, regarding the separate cases when data is read from the four-value memory region 21 and when data is read from the two-value memory region 22.

Figure 5:
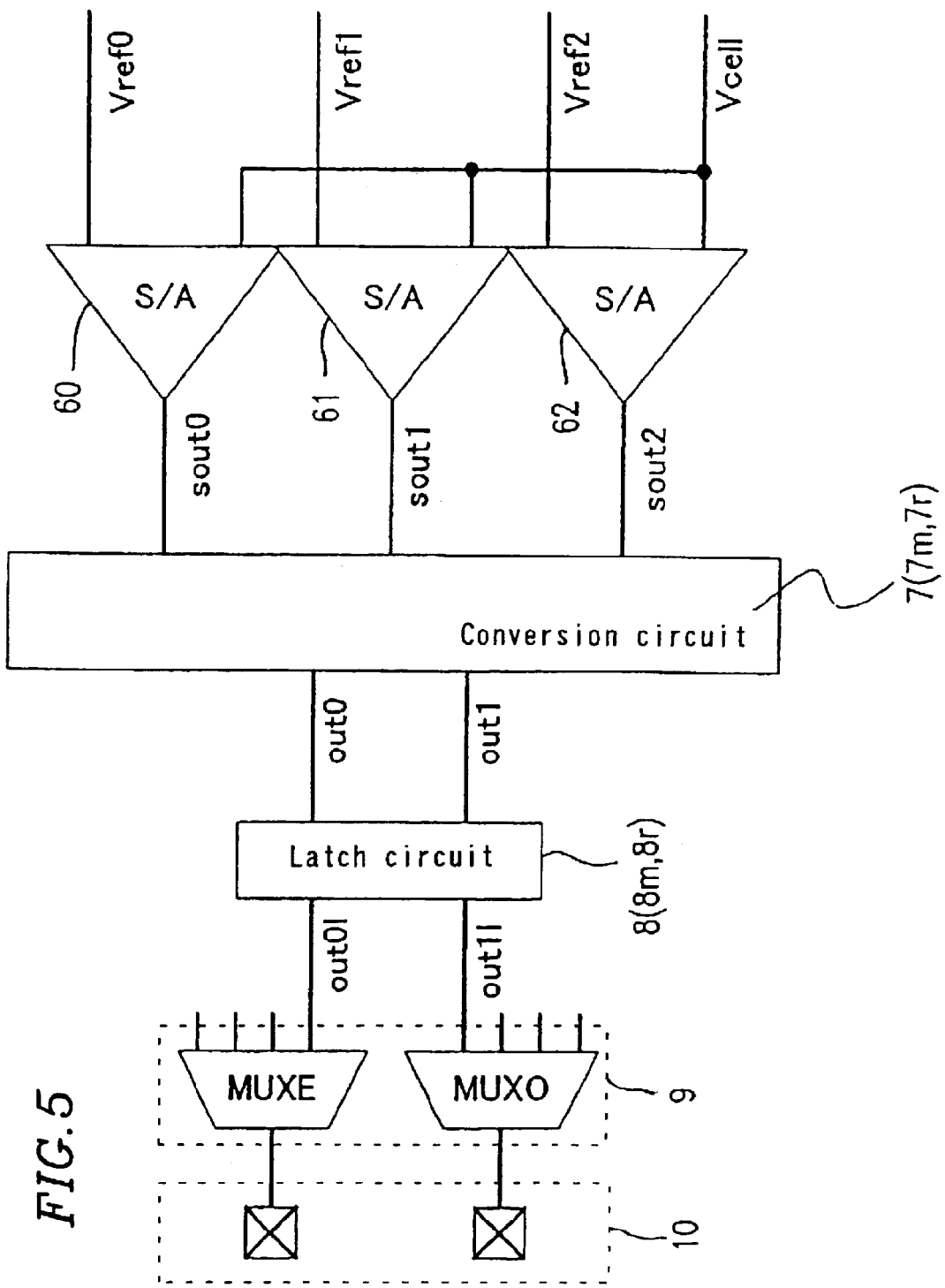
FIG. 5 is a diagram showing an exemplary circuit configuration of a signal path within a sense amplifier and thereafter of FIG. 1.

FIG. 5 shows an exemplary circuit configuration of a signal path in a read operation within the sense amplifier 6m0 (FIG. 1) and thereafter. A multiplexer MUXE is included in the multiplexer 9, which is connected to even numbered output pads I/O (output pad DQ2i where i=0, 1, 2, . . . , 7 in FIG. 1). A multiplexer MUXO is included in the multiplexer 9, which is connected to odd numbered output pads I/O (output pad DQ2i+1 where i=0, 1, 2, . . . , 7 in FIG. 1).

Hereinafter, an operation of the flash memory 1 will be described, in which data is read from the four-value memory region 21.

A signal indicating a voltage Vcell (the potential of a bit line of a normal cell) is input from a normal cell in the four-value memory region 21 via the signal line 11m0 to the normal cell sense amplifier 6m. The signal indicating voltage Vcell is compared with the reference potentials Vref0, Vref1; and Vref2 which are input from the reference cell 18 via the switch circuit 19 to the normal cell sense amplifier 6m. A signal indicating the result of the comparison is output as a 3-bit signal sout [2:0]. Here, the threshold voltage values of a memory cell are predetermined by three reference cells.

The sense amplifier 6m0 comprises three sense amplifiers S/A60 to S/A62, each of which has two input terminals (FIG. 5). One input terminal of each of the three sense amplifiers S/A60 to S/A62 is connected to the signal line 11m0. The signal line 11m0 is connected to a bit line connected to a memory cell selected for data read.

To the other input terminal of the sense amplifier S/A60 (its output is sout0) is input a signal indicating a reference potential (reference voltage) Vref0 generated by current-voltage conversion of a cell current flowing through a first reference cell (not shown). The sense amplifier S/A60 compares the potential (cell potential) of the signal line 11m0 with the reference potential Vref0 and outputs a signal indicating the result as output sout0.

To the other input terminal of the sense amplifier S/A61 (its output is sout1) is input a signal indicating a reference potential (reference voltage) Vref1 generated by current-voltage conversion of a cell current flowing through a second reference cell (not shown). The sense amplifier S/A61 compares the potential (cell potential) of the signal line 11m0 with the reference potential Vref1 and outputs a signal indicating the result as output sout1.

To the other input terminal of the sense amplifier S/A62 (its output is sout2) is input a signal indicating a reference potential (reference voltage) Vref2 generated by current-voltage conversion of a cell current flowing through a third reference cell (not shown). The sense amplifier S/A62 compares the potential (cell potential) of the signal line 11m0 with the reference potential Vref2 and outputs a signal indicating the result as output sout2.

Figure 6:
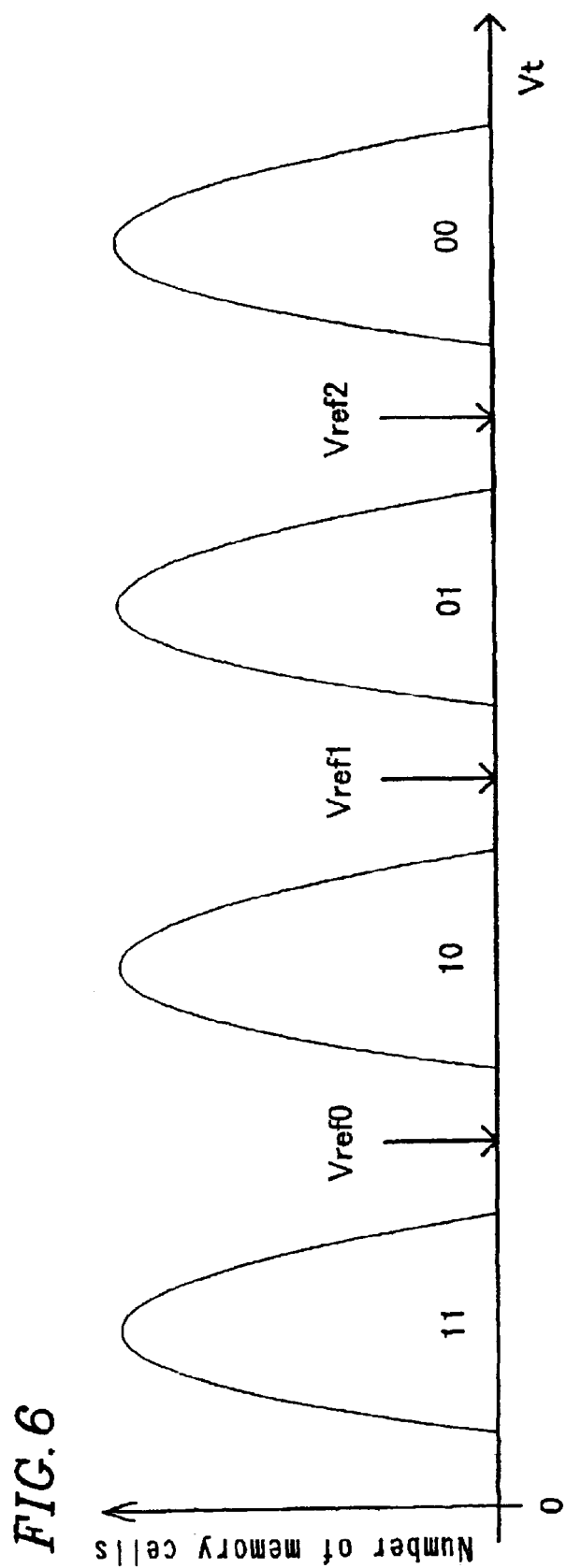
FIG. 6 is a diagram showing a relationship between the distribution of the threshold values of a memory cell storing four-value data and reference potentials which are referenced in data read.

FIG. 6 shows a relationship between the distribution of the threshold values of a memory cell storing four-value data and reference potentials which are referenced in data read. In FIG. 6, the horizontal axis represents the threshold voltage Vt of a memory cell and the vertical axis represents the number of memory cells.

For example, as shown in FIG. 6, the reference potentials Vref0, Vref1, and Vref2 are placed in gaps between each of four regions of the threshold voltage Vt corresponding to data "11", "10", "01", and "00". Thus, it is possible to determine whether stored data corresponds to "11", "10", "01", or "00" in accordance with the reference potentials Vref0, Vref1, and Vref2.

The signal sout[2:0], indicating the result of comparison of a cell voltage and the reference potentials performed by the sense amplifiers S/A60 to S/A62, is encoded by a conversion circuit 7. The resultant signal is output as 2-bit data out[1:0] (four-value data). Each of the signals sout0 to sout2 is 1-bit data which indicates a low level "0" or a high level "1", depending on the result of comparison.

For example, when the identification signal MLCB (="0") is input from the control circuit 17 to the conversion circuit 7 (FIG. 4), out1=sout1. When sout1="1", out0=sout0. When sout1="0", out0=sout2.

Therefore, when the signals (sout2, sout1, sout0) are ("0", "0", "0") or ("0", "0", "1"), (out1, out0) are ("0", "0"). When the signals (sout2, sout1, sout0) are ("0", "1", "1") or ("1", "1", "1"), (out1, out0) are ("1", "1"). When the signal (sout2, sout1, sout0) are ("0", "1", "0") or ("1", "1", "0"), (out1, out0) are ("1", "0"). When the signals (sout2, sout1, sout0) are ("1", "0", "0") or ("1", "0", "1"), (out1, out0) are ("0", "1").

As described above, 3-bit data output from the normal cell sense amplifier 6m is converted to 2-bit data by the conversion circuit 7.

The foregoing description is given of the signal flow when the potential of the signal line 11m0 is compared with a reference potential to read data (four-value data) from a memory cell. When data (the potentials of the signal lines 11m1 to 11m31, and 11r0 and 11r1) is simultaneously read from other memory cells, signals flow in a similar manner.

The thus-read data is latched by the latch circuit 8m (latch circuits 8m0 to 8m31) or the latch circuit 8r (latch circuits 8r0 and 8r1). Data is selected by the multiplexer (MUX) 9 and is output from the output pad 10 (output pads DQ0 to DQ15).

As shown in FIGS. 1 and 5, in a 2-bit signal output from the latch circuit 8m, an even-numbered bit is input to a multiplexer (MUX) (hereinafter referred to as an even-numbered multiplexer) connected to an even-numbered output pad I/O, while an odd-numbered bit is input to a multiplexer (MUX) (hereinafter referred to as an odd-numbered multiplexer) connected to an odd-numbered output pad I/O. In a 2-bit signal output from the latch circuit 8r, all even-numbered bits (r0_0 and r1_0) are input to even-numbered multiplexers, while all odd-numbered bit (r0_1 and r1_1) are input to odd-numbered multiplexers.

The position of a defective memory cell varies among flash memories. Therefore, by connecting the latch circuit 8 and the multiplexer (MUX) 9 as described above, data read from a normal cell can be replaced with data read from a redundant cell in all of the even-numbered multiplexers and odd-numbered multiplexers.

The redundant determination circuit 16 determines whether or not data read from a normal cell is to be replaced with data read from a redundant cell and the replaced data is to be output via the output pad 10 from the multiplexer (MUX) 9.

For example, when a memory cell connected to the signal line 11m0 is defective, the address of the memory cell is previously stored in the redundant address memory circuit 15. When trying to read the cell, the redundant determination circuit 16 compares the address stored in the redundant address memory circuit 15 with an internal column address (including an internal block address). When the address stored in the redundant address memory circuit 15 matches the internal column address, a matching signal is output to the control circuit 17.

When the control circuit 17 receives a matching signal, the control circuit 17 determines that the memory cell at the address stored in the redundant address memory circuit 15 is a defective cell. When such a determination is made, the control circuit 17 outputs a control signal to multiplexers 90 and 91, which is used to output the redundant signals (r0_0 to r1_1) output from the latch circuit 8r to the output pad 10 instead of signals (p0_0 to p3_15) output from the latch circuit 8m.

When a defective cell address is previously stored, information regarding whether a redundant signal r0_[1:0] output from the latch circuit 8r0 or a redundant signal r1_[1:0] output from the latch circuit 8r1 is used can be simultaneously stored in the redundant address memory circuit 15. As a result, the control circuit 17 can utilize the information to output a control signal for selecting redundant signals to the multiplexers 90 and 91.

Hereinafter, a description will be given of an operation of the flash memory 1 in which data is read from the two-value memory region 22. Here, operations of the flash memory 1 different from when data is read from the four-value memory region 21 will be described.

Either when data is read from the four-value memory region 21 or when data is read from the two-value memory region 22, the same normal cell sense amplifier 6m (sense amplifiers 6m0 to 6m31) and the redundant cell sense amplifier 6r (sense amplifiers 6r0 and 6r1) are used. Therefore, when data read is changed from the four-value memory region 21 to the two-value memory region 22, the switch circuit 19 switches from the four-value data read reference potentials Vref0 to Vref2 to two-value data read reference potentials Vref0 to Vref2, for example, as shown in FIG. 7.

Figure 7:
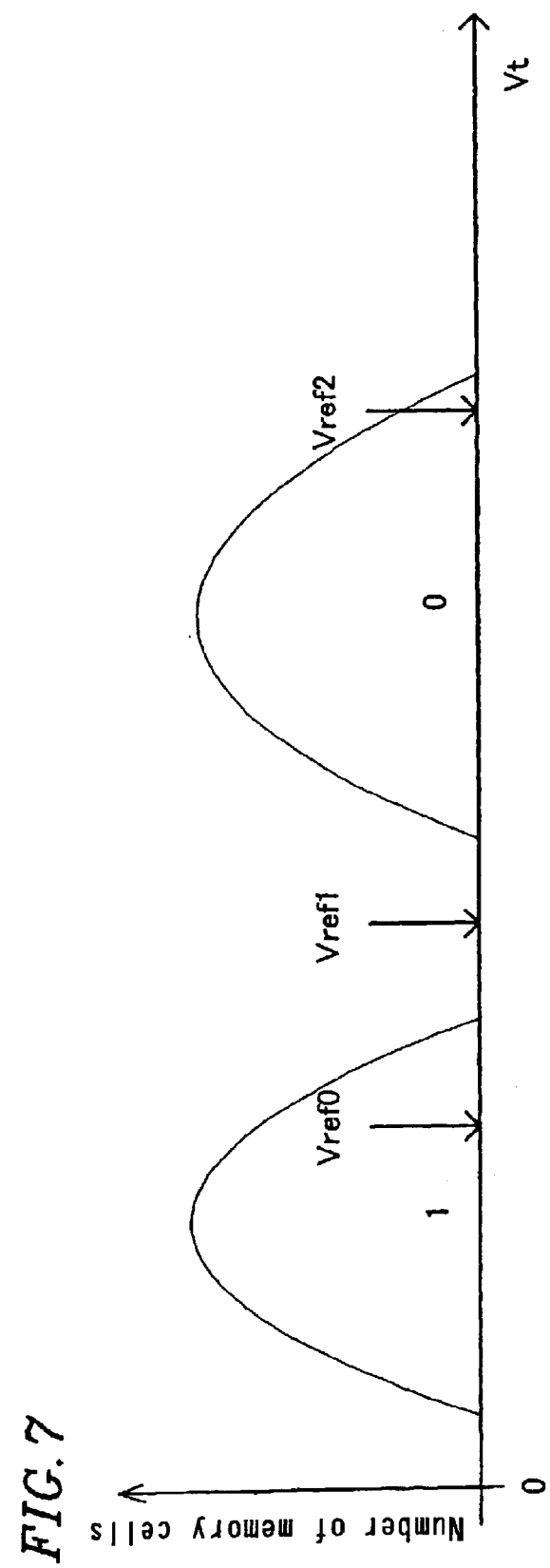
FIG. 7 is a diagram showing a relationship between the distribution of the threshold values of a memory cell storing two-value data and reference potentials which are referenced in data read.

FIG. 7 shows a relationship between the distribution of the threshold values of a memory cell storing two-value data and reference potentials which are referenced in data read. In FIG. 7, the horizontal axis represents the threshold voltage Vt of a memory cell and the vertical axis represents the number of memory cells.

For example, as shown in FIG. 7, the reference potential Vref1 is placed in a gap between two regions of the threshold voltage Vt corresponding to respective data "1" and "0". The reference potentials Vref0 and Vref2 are placed on the opposite sides of the reference potential Vref1. In accordance with the reference potential Vref1, whether stored data corresponds to "1" or "0" is determined.

The switch circuit 19 switches between four-value data read reference potentials and two-value data read reference potentials by a multiplexer or the like.

When data is read from a memory cell storing two-value data, it is determined whether stored data corresponds to "1" or "0", by referencing the threshold voltage Vt of the memory cell as shown in FIG. 7. To achieve this, the data (cell potential) of the memory cell is compared with the reference potential Vref1. The determination is not affected by the levels of the reference voltages Vref0 and Vref2. Note that the number of predetermined reference potentials is preferably minimized by setting the number of reference potentials to be the same as the number of reference potentials used when data is read from the four-value memory region 21.

When the reference voltage Vref1 needs to be adjusted depending on whether data is read from the four-value memory region 21 or the two-value memory region 22, a fourth reference cell may be employed. Such a fourth reference cell is provided in the reference cell 18. The threshold voltage of the fourth reference cell is predetermined. The switch circuit 19 can be used to switch from the output of the first reference cell to the third reference cell to the output of the fourth reference cell, thereby supplying an adjusted reference potential to a sense amplifier.

The identification signal MLCB is used to determine whether data read from the memory cell array 2 is two-value data (data stored in the two-value memory region 22) or four-value data (data stored in the four-value memory region 21). For example, the identification signal MLCB is generated by the control circuit 17 determining whether data is being read from the four-value memory region 21 or the two-value memory region 22.

Data stored in a memory cell may have identification data for determining whether the data contains four-value data or two-value data. In this case, the control circuit 17 determines whether data read from a memory cell is four-value data or two-value data, depending on identification data within the read data, thereby producing the identification signal MLCB.

The identification signal MLCB may be generated by any other method.

Thus, the conversion circuit 7 converts the sense amplifier outputs sout0 to sout2 to the 2-bit signal out[1:0]. In this case, the reference voltage Vref0 and the reference voltage Vref2 are not referenced for data read. Therefore, among sense amplifier outputs sout0 to sout2, the sense amplifier output sout1 is the only significant output. When the conversion circuit 7 having a circuit configuration as shown in FIG. 4 receives from the control circuit 17 the identification signal MLCB (="1") indicating that data is read from the two-value memory region 22, all bits of the multi-bit output are set to the same value. Thus, the conversion circuit 7 functions as a second switch section. As a result, the conversion circuit 7 outputs out1=out0=sout1.

Therefore, irrespective of the values of sout0 and sout2, when sout1 is "0", out1=out0="0", and when sout1 is "1", out1=out0="1".

Note that when data is read from the two-value memory region 22, only one of the values of out1 and out0 is required and the other may take any data (e.g., data indicating a voltage Vss). However, when a memory cell selected in the two-value memory region 22 is a defective cell and data needs to be read from a redundant cell, the setting of out1=out0 may reduce common conversion circuits, latch circuits, multiplexer circuits, and the like. Therefore, the circuit area can be reduced, whereby a simple conversion circuit may be constructed.

Thus, in the flash memory 1 according to Embodiment 1 of the present invention, reference potentials for use in the common normal cell sense amplifier 6m are switched by the switch section 19 to optimal reference voltages, depending on whether data is read from the two-value memory region 22 or the four-value memory region 21.

When the conversion circuit 7m reads and converts a result of comparison output by the normal cell sense amplifier 6m, the conversion circuit 7m switches and outputs read data, depending on whether data is read from the four-value memory region 21 or the two-value memory region 22. When data is read from the two-value memory region 22, only one bit has a significant output level among three bits output by the normal cell sense amplifier 6m. Therefore, when the conversion circuit 7m converts a 3-bit signal output by the normal cell sense amplifier 6m to a 2-bit signal, the 2-bit signal has two bits having the same output level. As a result, a sense amplifier is provided common to the memory operations of a multi-value memory region and a two-value memory region provided on the same chip.

Figure 8:
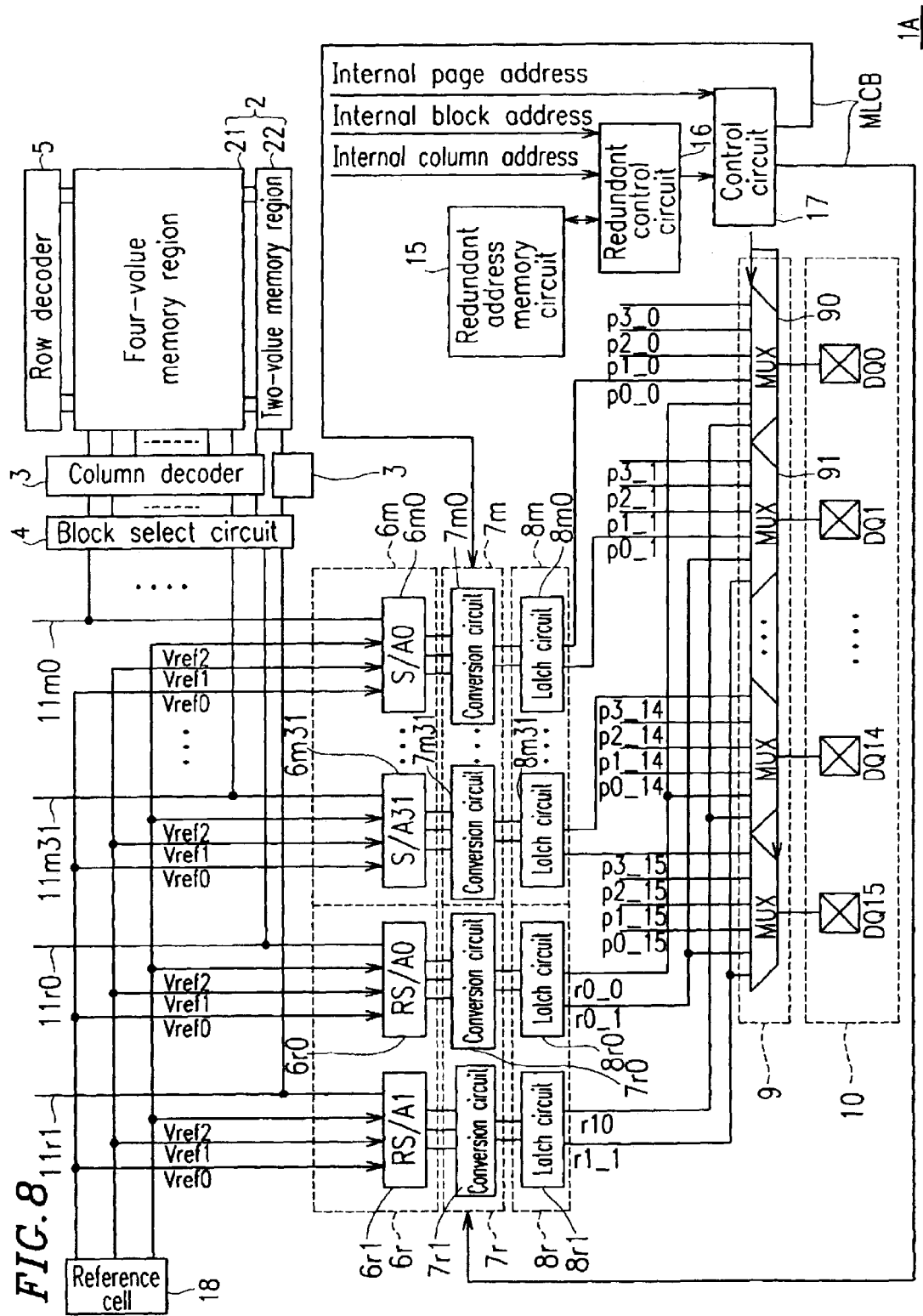
FIG. 8 is a diagram showing a configuration of a flash memory according to another embodiment of the present invention.

FIG. 8 shows a configuration of a flash memory 1A according to another embodiment of the present invention. In the flash memory 1A, when it is not necessary to adjust Vref1 depending on whether data is read from the four-value memory region 21 or the two-value memory region 22 (i.e., the reference potential Vref1 of FIG. 6 and the reference potential Vref1 of FIG. 7 are set to be the same value), the reference potential Vref1 can be used without being changed, the change depending on whether data is read from the four-value memory region 21 or the two-value memory region 22.

The flash memory 1A does not comprise the switch circuit 19 which is included in the flash memory 1. Therefore, in the flash memory 1A, the conversion circuit 7 subsequent to the sense amplifier 6 changes the number of bits in accordance with a result of comparison output by the sense amplifier 6, thereby switching data outputs depending on whether data is read from the multi-value memory region (e.g., a four-value memory region) or the two-value memory region. Thus, as in the flash memory 1, a sense amplifier is provided common to the memory operations of a multi-value memory region and a two-value memory region provided on the same chip. Further, as in the flash memory 1, when data is read from the two-value memory region, the conversion circuit 7 (conversion section) outputs data containing all bits having the same value through output terminals.

(Embodiment 2)

In the flash memory 1 according to Embodiment 1 of the present invention, a common sense amplifier section is used when either data is read from the two-value memory region or data is read from the multi-value memory region.

Hereinafter, a flash memory 1B according to Embodiment 2 of the present invention will be described, in which when data write or data delete is being performed in one of a two-value memory region and a multi-value memory region, a sense amplifier section is used to read data from the other memory region. The flash memory 1B comprises a memory cell array having a two-value memory region and a multi-value memory region (e.g., a four-value memory region).

Figure 9:
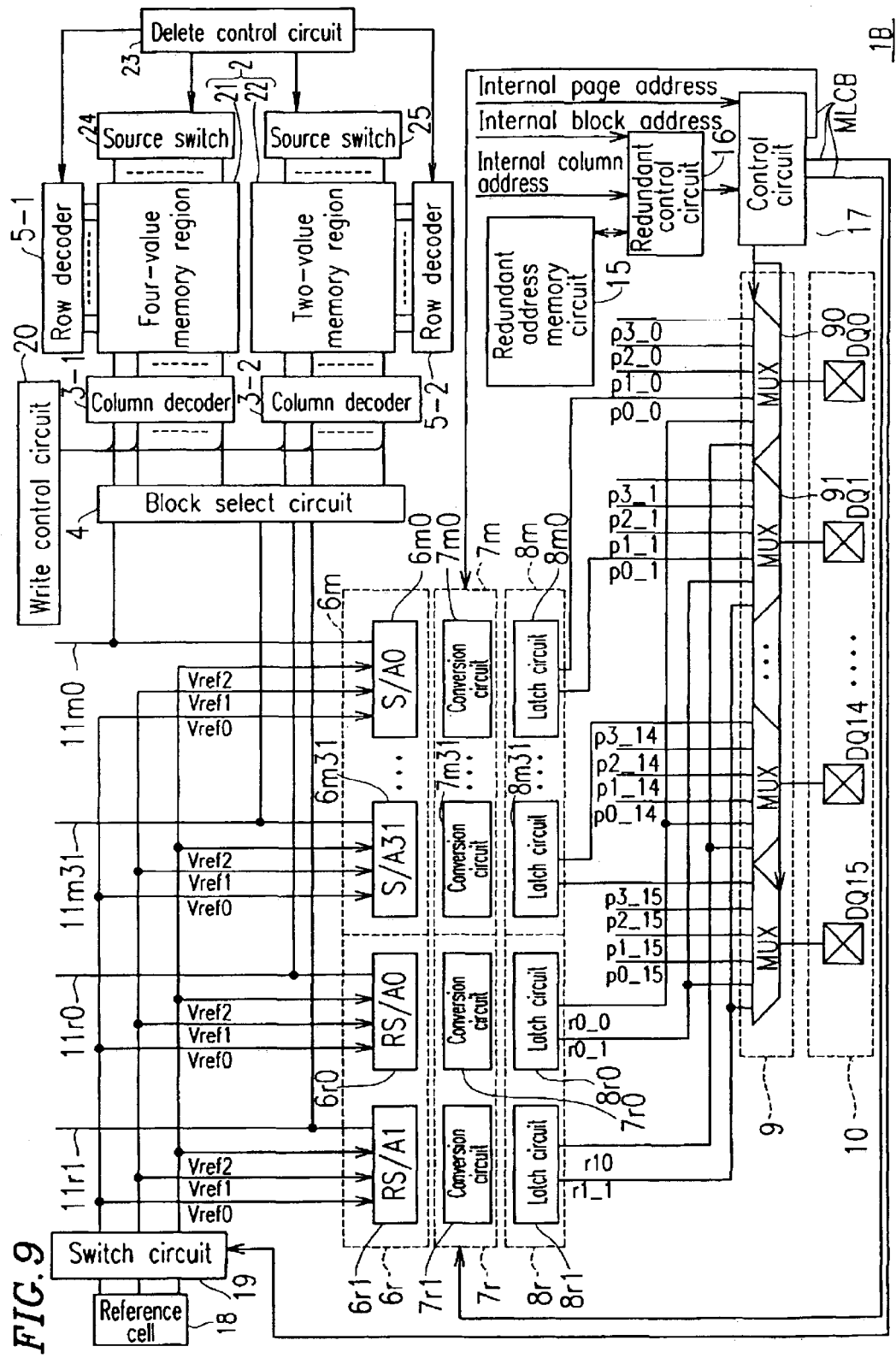
FIG. 9 is a diagram showing a configuration of a flash memory according to Embodiment 2 of the present invention.

FIG. 9 shows a configuration of the flash memory 1B according to Embodiment 2 of the present invention. Note that components having the same function as those in the flash memory 1 have the same reference numerals and explanation thereof is omitted.

Similar to the flash memory 1, the flash memory 1B comprises a memory cell array 2 in which a plurality of memory cells capable of storing data are arranged in a matrix. The memory cell array 2 comprises a four-value memory region 21 and a two-value memory region 22. The flash memory 1B further comprises a column decoder 3-1 and a column decoder 3-2 for selecting at least one bit line from a plurality of bit lines connected to the four-value memory region 21 and a plurality of bit lines connected to the two-value memory region 22 and applying a voltage to the selected bit lines separately; a block select circuit 4 for selecting at least one memory block from a plurality of memory blocks; and a row decoder 5-1 and a row decoder 5-2 for selecting at least one word line from a plurality of word lines connected to the four-value memory region 21 and a plurality of word lines connected to the two-value memory region 22 and applying a voltage to selected word lines independently.

The flash memory 1B further comprises a write control circuit 20 functioning as a write control section. The write control circuit 20 is connected to the column decoder 3-1 and the column decoder 3-2.

When the flash memory 1B performs write control, the write control circuit 20 applies a positive voltage via the column decoder 3-1 and the column decoder 3-2 to bit lines and a high positive voltage via the row decoder 5-1 and the row decoder 5-2 to word lines.

When the flash memory 1B performs delete control, a delete control circuit 23 applies a positive voltage via a source switch 24 and a source switch 25 to common source lines in blocks in the multi-value region (the four-value memory region 21) and the two-value memory region 22 and applies a negative voltage via the row decoder 5-1 and the row decoder 5-2 to word lines.

Thus, in the flash memory 1B, the write control circuit 20 functioning as a write control section, the delete control circuit 23 functioning as a delete control section, the source switch 24, and the source switch 25, constitute a write/delete control section.

In the flash memory 1B, the component used for data delete control and the component used for data write control are different from each other.

Similar to the flash memory 1, the flash memory 1B further comprises a normal cell sense amplifier 6m functioning as a sense amplifier section, a conversion circuit 7m connected to the normal cell sense amplifier 6m, and a latch circuit 8m connected to the conversion circuit 7m. A signal indicating a selected cell voltage is input via signal lines 11m0 to 11m31 to the normal cell sense amplifier 6m.

The flash memory 1B further comprises a redundant cell sense amplifier 6r functioning as a sense amplifier section, a conversion circuit 7r connected to the redundant cell sense amplifier 6r, and a latch circuit 8r connected to the conversion circuit 7r. A signal indicating a redundant cell voltage is input via signal lines 11r0 and 11r1 to the redundant cell sense amplifier 6r.

The flash memory 1B further comprises a multiplexer (MUX) 9 for selecting at least one output from the outputs of the latch circuit 8m and the latch circuit 8r, an output pad 10 connected to the multiplexer (MUX) 9, a redundant address memory circuit 15, a redundant determination circuit 16, a control circuit 17, a reference cell 18, and a switch circuit 19.

With the above-described configuration, the write control circuit 20 outputs write data to the column decoder 3-1 and the column decoder 3-2.

For example, while data is being written into the two-value memory region 22, data may be read from the four-value memory region 21. In this case, while the write control circuit 20 is outputting write data to the column decoder 3-2 for the two-value memory region 22, data is read from the four-value memory region 21 and is output via the column decoder 3-1 and the block select circuit 4 to the signal lines 11m0 to 11m31. The data output to the signal lines 11m0 to 11m31 is input to the normal cell sense amplifier 6m. In this manner, data read is performed.

For example, while data is being written to the four-value memory region 21, data may be read from the two-value memory region 22. In this case, while the write control circuit 20 is outputting write data to the column decoder 3-1 in the four-value memory region 21, data is read from the two-value memory region 22 and is output via the column decoder 3-2 and the block select circuit 4 to the signal lines 11m0 to 11m31. Data output to the signal lines 11m0 to 11m31 is input to the normal cell sense amplifier 6m, followed by a data read operation.

Further, in the flash memory 1B, while data is being deleted from the four-value memory region 21, data can be read from the two-value memory region 22. In the flash memory 1B, while data is being deleted from the two-value memory region 22, data can be read from the four-value memory region 21. In the flash memory 1B, while data is being deleted from the four-value memory region 21, data can be written into the two-value memory region 22. In the flash memory 1B, while data is deleted from the two-value memory region 22, data can be written into the four-value memory region 21.

Thus, data write and data read are performed for respective separate memory regions, so that the write control circuit 20 can determine whether or not data write is being performed for each memory region. The result of the determination is transferred to the control circuit 17 which in turn allows a memory region, in which data write is not being performed, to be subjected to data read.

Similar to the case where data write and data read are performed for respective separate memory regions, data delete and data read may be performed for respective separate memory regions by using the delete control circuit 23, the source switch 24, and the source switch 25.

Note that although not shown in FIG. 9, a latch circuit may be connected to each of a signal line connecting the column decoder 3-1 and the write control circuit 20 and a signal line connecting the column decoder 3-2 and the write control circuit 20, as disclosed in Japanese Laid-Open Publication No. 7-281952. In this case, the latch circuit holds the operational state of each memory region. The signal line connecting the column decoder 3-1 and the write control circuit 20 and the signal line connecting the column decoder 3-2 and the write control circuit 20 may be provided separately from a signal line used for data read. In this case, a selector circuit is used to select the signal lines.

In order to simultaneously perform data write and data read for a plurality of memory regions, it is required to determine whether or not data write or data delete is being performed for a target cell memory region. This determination may also be performed by the write control circuit 20 or the delete control circuit 23.

The semiconductor memory device of the present invention comprises a memory cell array including a multi-value memory region and a two-value memory region on the same chip. The semiconductor memory device of the present invention switches reference voltages, which are used in a sense amplifier section common to the data read of the two-value memory region and the data read of the multi-value memory region, by using a first switch section. Therefore, the semiconductor memory device of the present invention can use a read path common to the data read of the two-value memory region and the data read of the multi-value memory region. Therefore, the present invention can avoid the conventional problem that while one of a sense amplifier for the data read of the two-value memory region and a sense amplifier for the data read of the multi-value memory region is being used, the other is not used. Thus, the present invention can remove a wasted region occupied by such a disabled sense amplifier. The present invention can provide a semiconductor memory device having a small size, low power consumption, and low manufacturing cost.

Further, in the semiconductor memory device of the present invention, when data is read from the two-value memory region, the conversion circuit converts a multi-bit signal output from the sense amplifier to a 1-bit signal by setting all bits of the multi-bit signal to be the same output level. Therefore, two-value data can be obtained by a simple circuit configuration. Time required for circuit verification can be reduced.

Furthermore, in the semiconductor memory device of the present invention, while data write or data delete is performed for one of the two-value memory region and the multi-value memory region, data read is performed for the other. Therefore, the operation speed is high and time required for circuit verification can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
 a memory cell array comprising a two-value memory region and a multi-value memory region, wherein the two-value memory region comprises a plurality of memory cells each storing 1-bit data and the multi-value memory region comprises a plurality of memory cells each storing 2 or more-bit data and
 a sense amplifier section common to data read of the two-value memory region and data read of the multi-value memory region, for reading data stored in a selected memory cell by comparing a potential of the selected memory cell with a reference potential.

2. A semiconductor memory device according to claim 1, further comprising:
 a first switch section for switching the reference potential, depending on whether data is read from the two-value memory region or the multi-value memory region.

3. A semiconductor memory device according to claim 1, further comprising:
 a conversion section for changing the number of bits in accordance with a result of a comparison performed by the sense amplifier section, and switching output data, depending on whether or not the data is read from the multi-value memory region or the two-value memory region.

4. A semiconductor memory device according to claim 3, wherein:

the conversion section has two or more output terminals; and when data is read from the two-value memory region, the conversion section outputs the data through the output terminals, all bits of the data having the same value.

5. A semiconductor memory device according to claim 1, further comprising:

a redundant cell for replacing a defective memory cell in the memory cell array, if any; and a switch section for receiving data read from the selected memory cell and data read from the redundant cell, and switching from the data read from the selected memory cell to the data read from the redundant cell when the selected memory cell is the defective memory cell.

6. A semiconductor memory device according to claim 1, further comprising:

a write/delete control section for controlling data write or data delete for the two-value memory region and the multi-value memory region separately, wherein the sense amplifier section can perform data read for one of the two-value memory region and the multi-value memory region while the write/delete control section is performing data write or data delete for the other of the two-value memory region and the multi-value memory region.

7. A semiconductor memory device according to claim 1, further comprising:

a write/delete control section for controlling data write or data delete for the two-value memory region and the multi-value memory region separately, wherein the write/delete control section can perform data write or data delete for one of the two-value memory region and the multi-value memory region while the sense amplifier section is performing data read for the other of the two-value memory region and the multi-value memory region.

* * * * *